United States Patent [19]

Incardona

[11] Patent Number: 4,775,914
[45] Date of Patent: Oct. 4, 1988

[54] DEVICE FOR RAPIDLY TRANSFERRING CURRENT TO AN INDUCTIVE LOAD

[75] Inventor: Mario Incardona, Grugliasco, Italy
[73] Assignee: Iveco Fiat S.p.A., Turin, Italy
[21] Appl. No.: 928,986
[22] Filed: Nov. 10, 1986
[30] Foreign Application Priority Data
Nov. 12, 1985 [IT] Italy ................ 67953 A/85
[51] Int. Cl.$^4$ .............. H01H 47/00; H01H 47/32
[52] U.S. Cl. ................ 361/190; 361/159
[58] Field of Search ........... 361/159, 190, 154, 155, 361/159

[56] References Cited
U.S. PATENT DOCUMENTS
2,972,710 2/1961 D'Amico .................... 361/190
3,665,901 5/1972 Monpetit et al. ............ 361/190

FOREIGN PATENT DOCUMENTS
2913576 11/1979 Fed. Rep. of Germany ...... 361/159
2090092 6/1982 United Kingdom ............ 361/154

Primary Examiner—L. T. Hix
Assistant Examiner—David Porterfield
Attorney, Agent, or Firm—Kane, Dalsimer, Sullivan, Kurucz, Levy, Eisele and Richard

[57] ABSTRACT

A device comprising an inductor connected to current supply means; a condenser designed for parallel connection to an inductive load; and switch means having a short response time and controlled so as to interconnect the aforementioned supply means, inductor and condenser according to a number of sequentially prearranged circuit configurations.

1 Claim, 4 Drawing Sheets

DEVICE FOR RAPIDLY TRANSFERRING CURRENT TO AN INDUCTIVE LOAD

BACKGROUND OF THE INVENTION

The present invention relates to a device for rapidly transferring current to an inductive load.

As is generally known, high-power current often needs to be transferred in as short a time as possible to inductive elements, e.g. for controlling high-speed electrovalves and solenoids on electrically controlled Diesel injection systems.

At present, rapid transfer of high-power current to inductive elements is performed using devices the operating principle of which substantially consists in charging a condenser with high voltage via a converter supplied with low d.c. voltage. Thus, charged, the condenser is connected to the inductive load via a switch, for supplying the required current to the said inductive load. The drawbacks of such devices mainly derive from the fact that a fairly high voltage (substantially ranging from 100 to 200 V) must be maintained at the condenser terminals, and that the amount of current required by the load demands a relatively high-capacity condenser, which, in turn, results in cumbersome size of both the condenser and the device as a whole. Furthermore, for rapidly cutting off current supply to the load, the characteristics required of the said condensers are fairly stringent in terms of internal impedance, reliability and operating temperature, all of which make for high manufacturing cost. A further drawback lies in the formation of overvoltages at the terminals of the switch, which must therefore be suitably protected, e.g. by installing a parallel-connected Zener diode. If such is the case, however, a considerable amount of power is dissipated, should operating conditions require repeat control of the inductive load at fairly high frequency.

SUMMARY OF THE INVENTION

The aim of the present invention is to provide a device for rapidly transferring current to an inductive load, but involving none of the drawbacks presented by the aforementioned known devices.

With this aim in view, according to the present invention, there is provided a device for rapidly transferring an electric current, generated by given low-voltage supply means, to at least one inductive load, characterized by the fact that it comprises:

an inductor connected to the said current supply means; a condenser designed for parallel connection to the said inductive load; and a number of switch means having a short response time and controlled so as to interconnect the said supply means, inductor and condenser according to a number of sequentially prearranged circuit configurations.

BRIEF DESCRIPTION OF THE DRAWINGS

A number of preferred embodiments of the present invention will be described, by way of non-limiting examples, with reference to the accompanying drawings, in which.

DETAILED DESCRIPTION OF THE INVENTIONS

Figure 1:
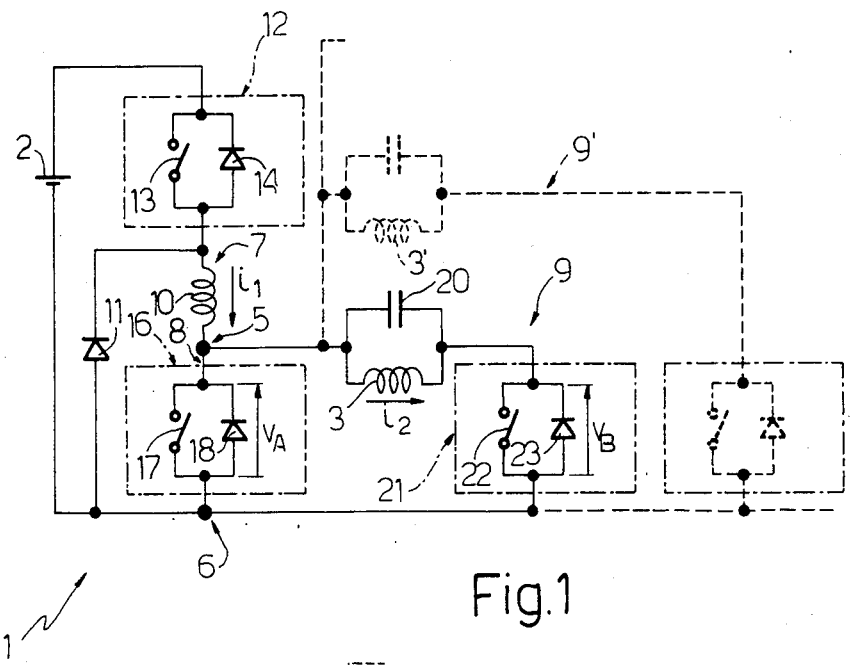
FIG. 1 shows a simplified electric diagram of a first embodiment of the device according to the present invention.

Number 1 in FIG. 1 indicates a device for rapidly transferring an electric current, generated by a d.c. supply source 2, to an inductive load 3. By way of example, the said inductive load may consist of an electrovalve or solenoid for activating an injection valve on a Diesel engine.

The device 1 circuit is substantially connected to two main nodes, 5 and 6, interconnected by three main branches 7, 8 and 9. In particular, branch 7 substantially comprises an inductor 10 having one terminal connected to node 5 and the opposite terminal connected to node 6 via the cathode-anode connection of diode 11, and via an electronic switch 12 series-connected to supply source 2 conveniently in the form of a battery. As shown, the circuit of the said electronic switch 12 substantially consists of a switch 13 to which is parallel-connected a diode 14. Electronic switch 12 is controlled by a known type of electronic circuit (not shown) and presents an extremely short response time (i.e. the time period between the arrival of a control signal and opening or closing of the respective switch 13).

Between nodes 5 and 6, branch 8 only presents an electronic switch 16 identical to the said electronic switch 12 and comprising a switch 17 to which is parallel-connected diode 18.

Between nodes 5 and 6, branch 9 presents inductive load 3 parallel-connected to condenser 20, and an electronic switch 21 identical to the said electronic switches 12 and 16 and also comprising a switch 22 parallel-connected to diode 23.

Parallel with branch 9, there may be connected a number of substantially identical branches (one of which is numbered 9'), each having a respective inductive load to which a given current is to be transferred.

Figure 2:
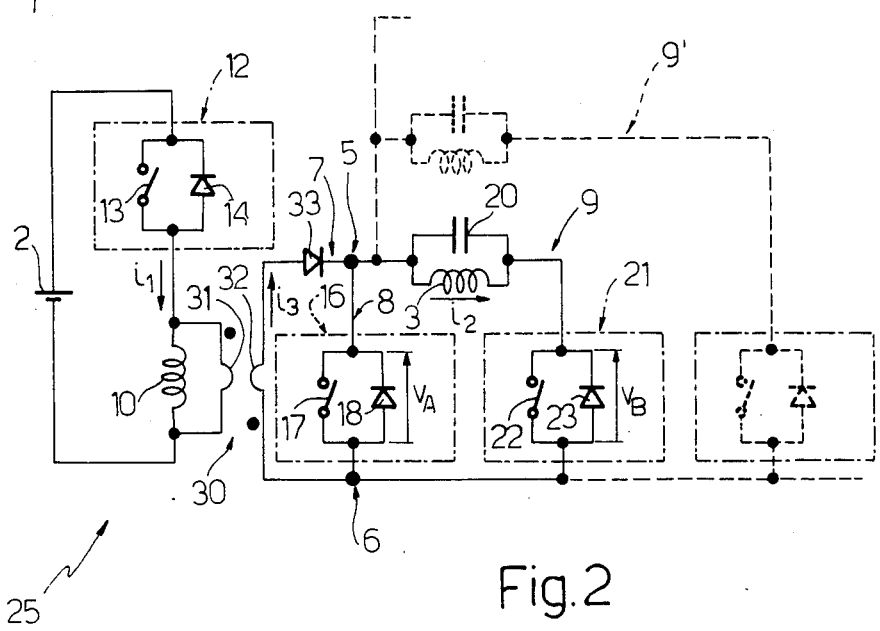
FIG. 2 shows a simplified electric circuit of a second embodiment of the device according to the present invention.

Number 25 in FIG. 2 indicates a second embodiment of the device according to the present invention and equivalent to device 1 as described above. As most of the component parts on device 25 are connected in substantially the same manner and perform the same functions as the corresponding parts on device 1, parts common to both are indicated using the same numbering system. Whereas branches 8 and 9 remain substantially unchanged, in the FIG. 2 embodiment, inductor 10 is connected to branch 7 via a transformer 30 the primary winding 31 of which is parallel-connected to inductor 10, and the secondary winding 32 of which is series-connected to a diode 33 so as to form, with the said diode 33, the new branch 7 of device 25. The black dots beside primary winding 31 and secondary winding 32 of transformer 30 indicator matching signs of the signals exchanged between the said windings.

Figure 3:
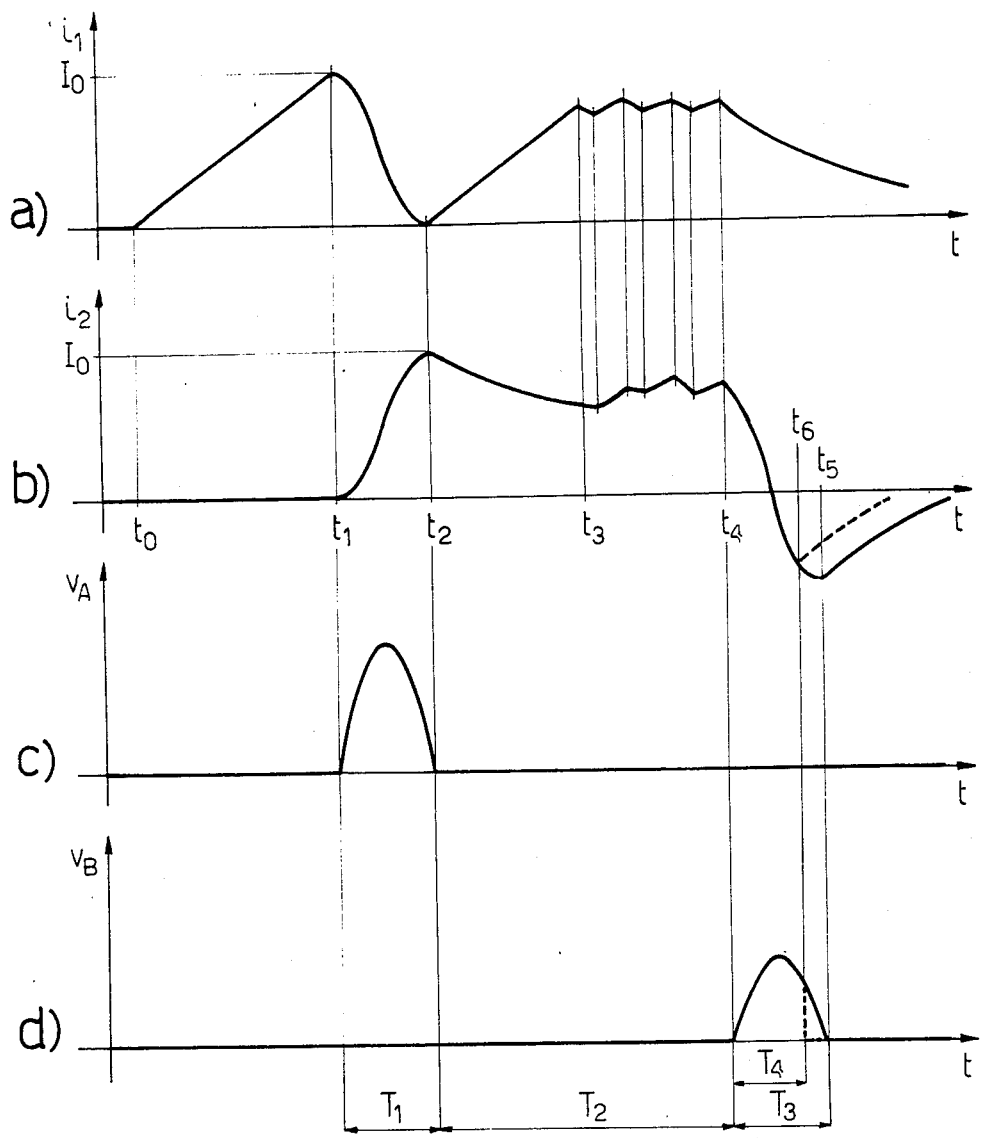
FIGS. 3 and 4 show time graphs of a number of electric signals picked up at given points in FIG. 1 under two different operating conditions.
Figure 4:
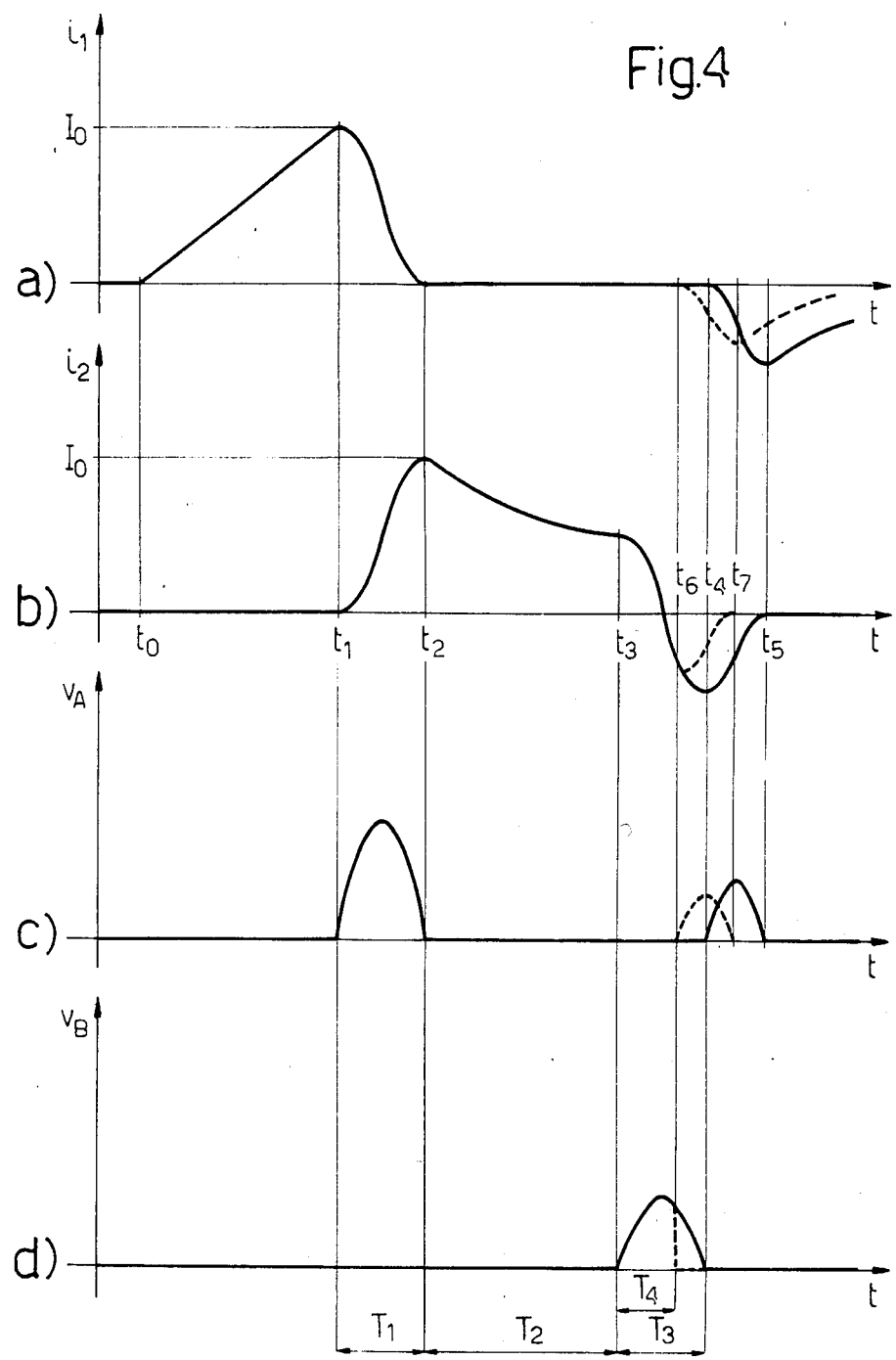
Figure 5:
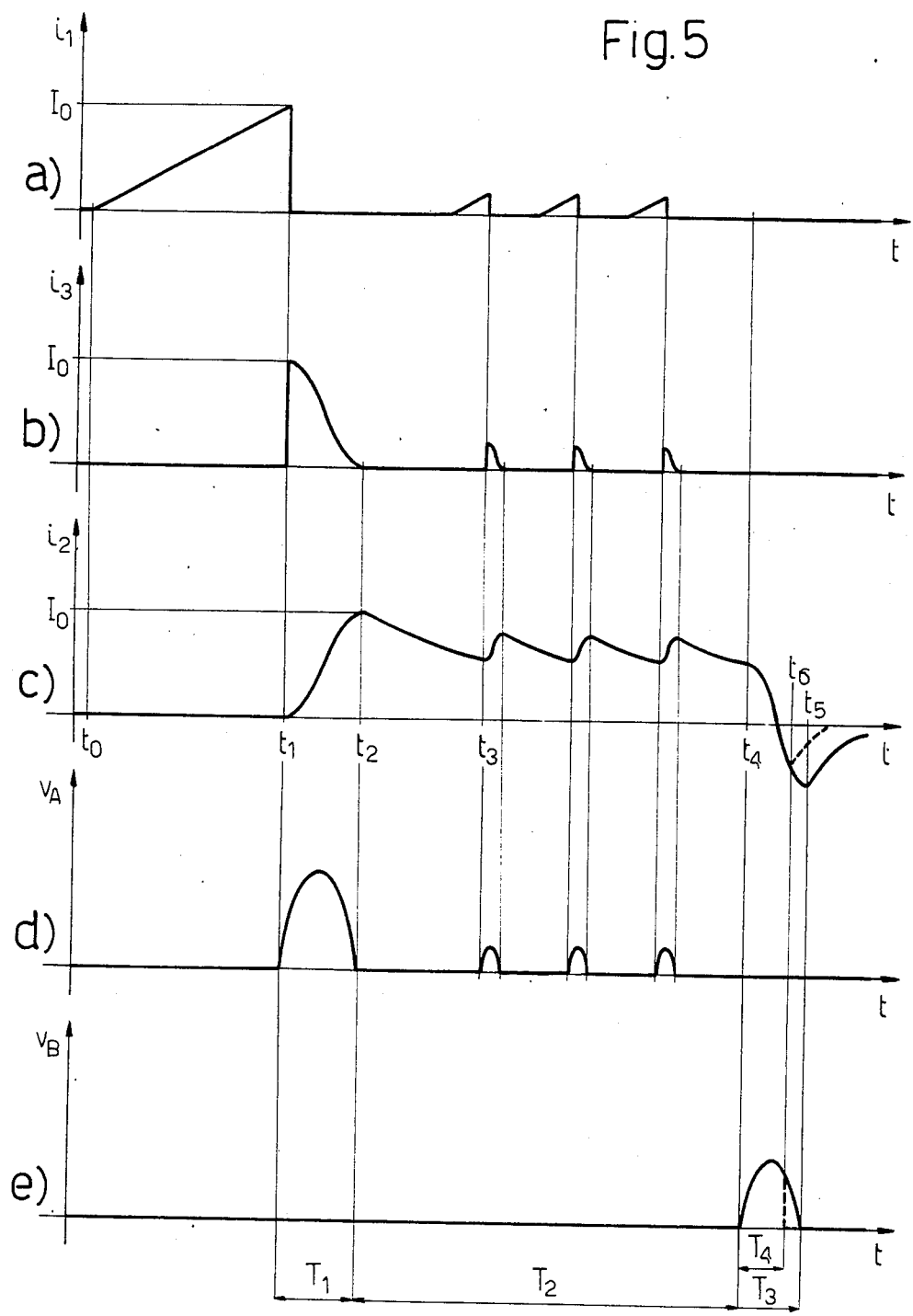
FIG. 5 shows graphs of a number of electric signals picked up at given points on the FIG. 2 circuit.

FIGS. 3 and 4 show time graphs of current ($i_1$, $i_2$) and voltage ($v_A$, $v_B$) signals picked up at corresponding points on the FIG. 1 circuit under two different operating conditions. Similarly, FIG. 5 shows time graphs of current ($i_1$, $i_2$, $i_3$) and voltage ($v_A$, $v_B$) signals picked up at corresponding points on the FIG. 2 circuit.

Operation of devices 1 and 25 will now be described with reference to the attached drawings. In particular, device 1 may operate in two different modes, which will be described separately, first with reference to FIGS. 1 and 3, and then with reference to FIGS. 1 and 4.

As shown in FIGS. 1 and 3, in a first operating phase, electronic switches 12 and 16 are kept closed, and switch 21 open. Consequently, between time points $t_0$ and $t_1$, the current $i_1$ flowing inside inductor 10 increases steadily and in proportion to the ratio between the voltage of battery 2 and the inductance of inductor 10. In the next phase, switch 16 is opened and switches 12 and 21 kept closed. Consequently, current $i_1$, which, at point $t_1$ when the said switches are tripped, equals $I_0$, flows into the group consisting of inductive load 3 and condenser 20, which combine to form a parallel oscillating circuit to which is connected inductor 10. Consequently, current $i_1$ drops sinusoidally down to 0, whereas current $i_2$ in load 3 rises to $I_0$ (point $t_2$). In the meantime, voltage $v_A$ at the terminals of electronic switch 16 has described a positive sinusoidal half wave. As the sign of the said voltage tends towards inversion, which is brought about by condenser 20 being reverse-charged for continuing oscillation, diode 18 is biased directly so as to substantially short-circuit nodes 5 and 6; which short-circuit results, on the one hand, in short-circuiting of condenser 20 and a consequent exponential decrease of current $i_2$, and, on the other, in a further increase of current $i_1$ as already described.

When current $i_1$ equals current $i_2$ (point $t_3$ in FIG. 3), current has ceased circulating in diode 18, and inductors 3 and 10 are series-connected and supplied by battery 2 via switch 12. From this point in time onwards, switch (chopper) 12 is opened and closed alternately so as to maintain currents $i_1$ and $i_2$ at a given value up to point $t_4$. During the interval $t_3$-$t_4$, currents $i_1$ and $i_2$ are the same : when switch 12 is closed, the said currents flow from battery 2 to series-connected inductors 10 and 3; whereas, when switch 12 is open, they are cut off via diode 11 and the said inductors 3 and 10.

In the next phase ($t_4$), switch 16 is closed and switches 12 and 21 opened. Consequently, current $i_1$ flowing inside inductor 10 is cut off via diode 11 and decreases exponentially, whereas current $i_2$ describes a decreasing sinusoidal half wave substantially presenting at $t_5$, the same value and the opposite pattern to that of $t_4$. Accordingly, voltage $v_B$ at the terminals of switch 21 describes the positive arc of a half wave. As the said voltage $v_B$, however, tends towards negative, diode 23 is biased directly so as to cause short-circuiting of condenser 20 and a consequent exponential decrease of current $i_2$ down to zero. Such a decrease may be anticipated if switch 22 is closed at $t_6$. This must be done, however, within the second quarter of the period $t_4$-$t_5$, in which case, current $i_2$ in load 3 may be brought more rapidly back to 0.

To conclude, therefore, and with special reference to FIG. 3d, current $i_1$ is transferred from inductor 10 to inductive load 3 within the space of a half interval ($T_1$). This is followed by an interval $T_2$, during which the current in load 3 is maintained over a given minimum value, and, finally, an interval $T_3$ during which the current in load 3 is reversed and drops off gradually down to 0. Interval $T_3$ may be further reduced ($T_4$) by appropriately operating switch 21 as already described.

As shown on the current $i_2$ graph, the said current $i_2$ rapidly reaches $I_0$, is maintained over a given minimum value for a given time interval ($T_2$), and then drops off, inverting its sign, within another brief time interval ($T_3$). Such a pattern is particularly useful in the event load 3 consists of an electromagnet, which requires a strong magnetizing current ($I_0$)supplied within a brief time interval ($T_1$): a current over a given minimum value for maintaining its control setting for an interval $T_2$; and an opposite-sign current for ensuring complete demagnetizing of the electromagnet core and so preventing possible jamming of the keeper.

A second operating mode of device 1, achieved by modifying the control sequence of switches 12, 16 and 21, will now be described with reference to FIGS. 1 and 4, wherein control of the said switches can be seen to follow the same pattern as described with reference to Fig. 3 up to $t_2$. From this point onwards, switches 12 and 16 are kept open, condenser 20 switches the sign of voltage $v_A$, and diode 18 is biased directly, thus resulting in short-circuiting of condenser 20 and an exponential decrease of current $i_2$. At $t_3$, switch 16 is closed, switch 21 opened and switch 12 left open. Consequently, current $i_2$ decreases to give a sinusoidal half wave presenting one positive and one negative quarter wave, and, accordingly, voltage $v_B$ describes a positive sinusoidal half wave up to $t_4$. Switch 21 is then closed and switch 16 opened, thus causing inductive load 3 to yield current to inductor 10, which is charged in such a manner as to cause current $i_1$ to described a sinusoidal portion up to $t_5$, at which it equals th value of current $i_2$ at $t_4$. From $t_5$, the sign of voltage $v_A$ tends towards inversion, thus causing direct biasing of diode 18, short-circuiting of load 3 and condenser 20, and zero maintenance of current $i_2$. Direct biasing of diode 18 also results in an exponential decrease of current $i_1$ which tends gradually towards 0. This situation may be anticipated by opening switch 16 and closing switch 21 at $t_6$, which anticipates the start of the current transfer phase from inductive load 3 to inductor 10, which transfer is completed at $t_7$. The corresponding wave forms of currents $i_1$ and $i_2$ and voltages $v_A$ and $v_B$ are shown by the dotted lines in FIG. 4.

The wave forms in FIGS. 3 and 4 have been drawn assuming a direct diode bias voltage of 0 and the same inductance on load 3 and inductor 10.

Operation of device 25 will now be described with reference to FIGS. 2 and 5. At $t_0$, only switch 12 is closed, thus causing current $i_1$ to rise steadily up to a given preset value $I_0$ at $t_1$. At this point, switch 12 is opened so as, presumably, to cause current $I_0$ to be transferred instantly onto secondary 32 of transformer 30 to give the same value $I_0$. Under such conditions ($t_1$), switch 21 is closed and switch 16 left open, thus causing current $i_3$ to be transferred from secondary 32 to load 3 in sinusoidal manner. When current $i_2$ reaches value $I_0$ ($t_2$), the sign of the voltage at the terminals of condenser 20 is inverted, thus causing direct biasing of diode 18, short-circuiting of condenser 20, and an exponential decrease of current $i_2$ upto $t_3$. For maintaining the said current over a given minimum value, however, switch (chopper) 12 is closed and opened periodically for a given length of time between $t_3$ and $t_4$. By so doing, current $i_2$ is maintained within the said given value by exploiting the performance of inductor 10 as already described in the interval $t_0$-$t_2$. This continues up to $t_4$, at which point switch 16 is closed and switch 21 opened, thus causing current $i_2$ to described a sinusoidal half wave and to switch from a maximum value at $t_4$ to minimum value, at $t_5$, equal to but opposite in sign to that of $t_4$. From $t_5$, the sign of the voltage at the terminals of condenser 20 switches so as to cause direct biasing of diode 23 which short-circuits load 3 and condenser 20 so as to cause an exponential decrease of current $i_2$ on load 3. In this case also, exponential decreasing of current $i_2$ may be commenced prior to $t_5$ by closing switch 21 at $t_6$ so as to anticipate short-circuiting of load 3 and condenser 20. It is essential, however, that switch 21 be closed only after current $i_2$ has switched to negative.

The advantages of the devices according to the present invention will be clear from the foregoing description. First and foremost, they provide for rapidly transferring even very high currents to inductive loads using only low voltage, while at the same time preventing dissipation by only employing elements such as inductor 10 and condenser 20. They also provide for minimizing the number of electronic switches employed, which, in particular, may be formed using static MOSFET switches with all the advantages these afford. Further advantages obtainable using devices 1 and 25 substantially consist in rapid zeroing of load current when the latter is cut off; demagnetizing of the user (e.g. having a magnetic core) when the current is cut off, by virtue of the negative current on the load; the possibility of maintaining load current indefinitely and with substantially no dissipation; and, finally, optimization of inductor 10 by providing for the same inductance on both inductor 10 and the load.

To those skilled in the art it will be clear that changes may be made to devices 1 and 25 as described and illustrated herein without, however, departing from the scope of the present invention.

I claim:

1. A device for rapidly transferring an electric current generated be a given low-voltage supply means, to at least one inductive load, comprising:
    an inductive load;
    an inductor connected to said supply means;
    a condenser connected in parallel to said inductive load;
    a number of switch means having a short response time;
    an electrical transformer having a primary winding and a secondary winding wherein said primary winding is connected in parallel to said inductor and in parallel to a path including the low-voltage supply means and a first of said number of switch means; and
    two main points connected by a number of secondary paths wherein a first of said secondary paths includes said secondary winding, a second of said secondary paths includes a second of said number of switch means, and a third of said secondary paths includes said condenser, said inductive load in parallel with said condenser and a third of said number of switch means.

* * * * *